United States Patent
Suzuki et al.

(10) Patent No.: US 7,002,113 B2
(45) Date of Patent: Feb. 21, 2006

(54) HEATER INSPECTION APPARATUS AND SEMICONDUCTOR MANUFACTURING APPARATUS HAVING HEATER INSPECTION APPARATUS MOUNTED THEREON

(75) Inventors: Masayuki Suzuki, Tokyo (JP); Hideo Ishizu, Tokyo (JP)

(73) Assignee: Kokusai Electric Semiconductor Service Inc., Tokyo (JP)

( * ) Notice: Subject to any disclaimer, the term of this patent is extended or adjusted under 35 U.S.C. 154(b) by 200 days.

(21) Appl. No.: 10/670,337

(22) Filed: Sep. 26, 2003

(65) Prior Publication Data

US 2005/0056635 A1 Mar. 17, 2005

(30) Foreign Application Priority Data

Mar. 31, 2003 (JP) .............................. 2003-097153
Mar. 31, 2003 (JP) .............................. 2003-097157
Sep. 16, 2003 (JP) .............................. 2003-322390

(51) Int. Cl.
*B23K 13/08* (2006.01)

(52) U.S. Cl. ..................................... 219/482; 219/497

(58) Field of Classification Search ........ 219/481–482, 219/488, 490, 494, 497, 504, 505, 506
See application file for complete search history.

(56) References Cited

U.S. PATENT DOCUMENTS

| | | | |
|---|---|---|---|
| 4,511,791 A | 4/1985 | Desai et al. | |
| 4,978,837 A | 12/1990 | Eggleston | |
| 5,280,422 A | 1/1994 | Moe et al. | |
| 5,656,190 A | 8/1997 | Aoki | |
| 5,788,789 A | 8/1998 | Cooper | |

FOREIGN PATENT DOCUMENTS

| | | | |
|---|---|---|---|
| JP | A 4-155828 | | 5/1992 |
| JP | 2000260716 A | * | 9/2000 |

* cited by examiner

*Primary Examiner*—Tu Hoang
(74) *Attorney, Agent, or Firm*—Oliff & Berridge, PLC (57) ABSTRACT

A heater inspection apparatus including an applying unit, a current detector, a voltage detector, a temperature detector, a memory, a first calculating unit, a second calculating unit and a finding unit is provided. The applying unit applies an electrical power to a heater based on an AC power source. The current detector detects a current flowing through the heater. The voltage detector detects a voltage applied to the heater. The temperature detector detects a temperature of the heater. A temperature coefficient of resistance is stored in advance on the memory. The first calculating unit and the second calculating unit respectively calculate a resistance of the heater at an inspection time and a reference time. The finding unit finds a deterioration degree of the heater based on results of the first and second calculating units.

18 Claims, 7 Drawing Sheets

| IDENTIFICATION NUMBER | TEMPERATURE COEFFICIENT (20°C) | TEMPERATURE COEFFICIENT (850°C) | TEMPERATURE COEFFICIENT (1000°C) | LENGTH (m) | CROSS SECTIONAL AREA (m²) | REFERENCE RESISTANCE VALUE (Ω) |
|---|---|---|---|---|---|---|
| HEATER 7A | 1.00 | 1.01 | 1.04 | 1000 | $4 \times 10^{-6}$ | 4.557 |
| HEATER 7B | 1.00 | 1.01 | 1.04 | 1500 | $4 \times 10^{-6}$ | 9.4 |

HEATER INSPECTION APPARATUS AND SEMICONDUCTOR MANUFACTURING APPARATUS HAVING HEATER INSPECTION APPARATUS MOUNTED THEREON

BACKGROUND OF THE INVENTION

1. Field of the Invention

The present invention relates to a heater inspection apparatus and a semiconductor manufacturing apparatus having the heater inspection apparatus thereon.

2. Description of the Related Art

Conventionally, a heater of a resistance heating type made of molybdenum disilicide whose resistance value is low at normal temperature and becomes larger in accordance with the increase in temperature has been in use in a heat treatment apparatus, as a semiconductor manufacturing apparatus, for heat-treating objects to be processed in a furnace at high temperature (See Patent Document 1, for example).

As a heater inspection apparatus of such a semiconductor manufacturing apparatus, one as described below is available.

Figure 7:
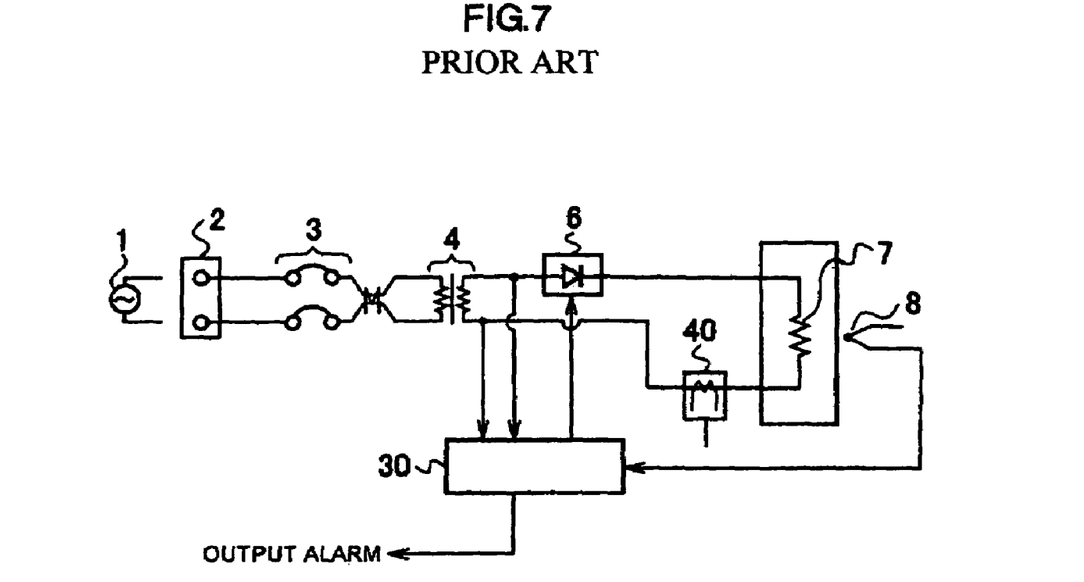
FIG. 7 is a circuit diagram of a heater inspection apparatus as a conventional example 1 and a semiconductor manufacturing apparatus having the heater inspection apparatus mounted thereon.

FIG. 7 is a circuit diagram of a heater inspection apparatus as a first conventional example and a semiconductor manufacturing apparatus having the heater inspection apparatus mounted thereon.

FIG. 7 shows a commercial power source 1, a terminal block 2 for power reception, a protective breaker (NFB) 3, a power source transformer 4, a thyristor 6 for controlling heater power, a heater 7 for heating, a thermocouple 8 that measures the temperature of the heater 7, a current transformer 40 for detecting a disconnection of the heater 7, and a thermoregulator 30 that controls the temperature of the heater 7.

In controlling the temperature of the heater 7, the protective breaker 3 and the thyristor 6 are turned on while the commercial power source 1 is being supplied to the terminal block 2 for power reception, so that the commercial power source 1 is supplied to the heater 7 via the protective breaker 3 and the thyristor 6.

At this time, a current passes through the heater 7 to raise the heater temperature. The thermocouple 8 for temperature measurement converts the raised temperature of the heater 7 to an electrical signal to feed it back to the thermoregulator 30. The thermoregulator 30 computes a difference between a numerical value fed back from the thermocouple 8 and a set temperature of the heater 7 to control on/off of the thyristor 6.

The disconnection of the heater 7 can be detected by discriminating whether or not a current flows through the current transformer 40 for current detection. Specifically, it is judged that the disconnection exists when no current flowing from the current transformer 40 to the heater 7 is detected even though the thermoregulator 30 outputs to the thyristor 6 a command for power supply to the heater 7.

Figure 8:
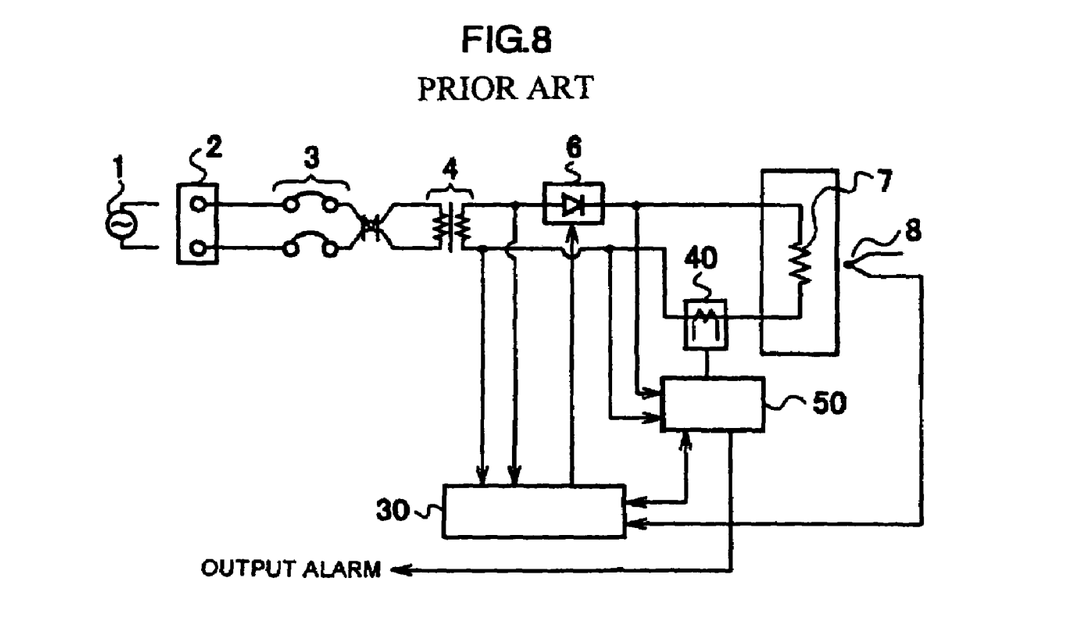
FIG. 8 is a circuit diagram of a heater inspection apparatus as a conventional example 2 and a semiconductor manufacturing apparatus having the heater inspection apparatus mounted thereon.

FIG. 8 is a circuit diagram of a heater inspection apparatus as a second conventional example and a semiconductor manufacturing apparatus having the heater inspection apparatus mounted thereon.

FIG. 8 shows, in addition to the portions shown in FIG. 7, a disconnection detector 50 that discriminates the existence of the disconnection of the heater 7. A heating method of the heater 7 is the same as that explained using FIG. 7.

In the second conventional example, in order to detect the disconnection of the heater 7, a current flowing through the current transformer 40 for current detection is measured, so that the disconnection of the heater 7 can be discriminated. Specifically, the disconnection detector 50 monitors a terminal voltage of the heater 7 that is supplied to the heater 7 and a power supplied to the heater 7 from the current transformer 40, and when a great change in a current change rate of the heater 7 is detected or when no current can be detected, even though the terminal voltage of the heater 7 exists, it is judged that the disconnection exists.

(Patent Document 1)

Japanese Patent Laid-open No. Hei 4-155828

In the conventional art, however, monitoring of a current in a heater is only possible way as a method of detecting the disconnection of the heater, and the best that can be done to replace the heater before the disconnection occurs is to make judgment based on materials of the heater and its usage environment.

The disconnection of a heater does not allow normal heat treatment in a furnace, resulting in problems such as a defective lot of objects to be processed, which gives influence to productivity. The influence is especially significant in a vertical furnace since a large number of objects to be processed are processed at a time therein. In order to compensate for this situation, spare heaters are prepared and periodical replacement is conducted. However, the life of the heater is leniently judged, and consequently, such a problem also arises that the disconnection occurs within a period of an estimated life span.

SUMMARY OF THE INVENTION

Therefore, it is an object of the present invention to provide a heater inspection apparatus and a semiconductor manufacturing apparatus having the heater inspection apparatus mounted thereon, the heater inspection apparatus being capable of urging heater replacement by finding the deterioration degree of a heater, and when the heater needs replacement, giving a warning to that effect A first invention is a heater inspection apparatus that comprises an applying unit that applies a power element to a heater heated based on an AC power source; a current detector that detects a current flowing through the heater when the power element is applied to the heater by the applying unit; a voltage detector that detects a voltage applied to the heater when the power element is applied to the heater by the applying unit; a temperature detector that detects a temperature of the heater being heated by the applying unit; a memory on which a temperature coefficient of resistance for use in calculation of a resistance of the heater at a reference time is stored in advance; a first calculating unit that calculates a resistance of the heater at an inspection time based on respective detection results of the voltage detector and the current detector; a second calculating unit that calculates the resistance of the heater at the reference time based on a detection result of the temperature detector and the temperature coefficient of resistance stored on the memory; and a finding unit that finds a deterioration degree of the heater based on the resistance of the heater at the inspection time calculated by the first calculating unit and the resistance of the heater at the reference time calculated by the second calculating unit.

In short, in the present invention, the deterioration degree of a heater is found through the utilization of such a characteristic that a heater main body becomes thin due to the deterioration of the heater, which in turn causes the increase in resistance of the heater. For example, when an actually measured resistance of a heater exceeds a resistance of the heater at a reference time by an increase amount more than a predetermined value, it is judged that the heater is so deteriorated that it needs replacement.

A second invention is a heater inspection apparatus in which, in the first invention, the applying unit that applies the power element is the AC power source that heats the heater, the current detector detects a level of a current flowing through the heater when an AC voltage is applied to the heater by the AC power source, the voltage detector detects a level of a voltage applied to the heater when the AC voltage is applied to the heater by the AC power source, and the temperature detector detects a temperature of the heater being heated by the AC power source.

This structure can simplify the configuration since the AC power source that heats the heater is used as the applying unit for heater inspection. Further, the heater inspection can be conducted during an idle state that is a period during which the heater is heated by the AC power source.

A third invention is a heater inspection apparatus that, in the first invention, further comprises an interrupting unit that interrupts a route between the AC power source and the heater heated based on the AC power source, and in which the applying unit that applies the power element is a DC power source that applies a DC voltage to the heater when the interrupting unit is interrupting the route, the current detector detects a current flowing through the heater when the DC voltage is applied to the heater by the DC power source, the voltage detector detects a DC voltage applied to the heater when the DC voltage is applied to the heater by the DC power source, and the temperature detector detects a temperature of the heater being heated by the DC power source.

This structure can improve precision in finding the deterioration degree of a heater since the DC power source different from the AC power source that heats the heater is used as the applying unit for heater inspection. Further, the inspection is conducted while the route is being interrupted by the interrupting unit, which makes it possible to avoid the interference between the AC power source and the DC power source at a resistance inspection time. In addition, if the period during which the route is interrupted by the interrupting unit is defined as a transient period so as not to influence a heating operation by the heater, the heater inspection can be effectively conducted even during the heating operation by the heater.

A fourth invention is a heater inspection apparatus that, in the first invention, further comprises an interrupting unit that interrupts a route between the AC power source and the heater heated based on the AC power source, and in which the applying unit is a DC constant current source that supplies a DC constant current to the heater irrespective of whether the route is interrupted or not interrupted by the interrupting unit, the current detector detects a current made to flow through the heater by the DC constant current source, while the route is being interrupted by the interrupting unit, the voltage detector detects a DC voltage applied to the heater by the DC constant current source, while the route is being interrupted by the interrupting unit, and the temperature detector detects a temperature of the heater being heated by the DC constant current source, while the route is being interrupted by the interrupting unit.

This structure can realize, in addition to the effect of the fourth invention, the reduction in the loss time which occurs when the route is changed or a current rises since the DC constant current source constantly supplies a current irrespective of whether or not the route is interrupted.

A fifth invention is a heater inspection apparatus in which, in the third invention or the fourth invention, the interrupting unit obtains, from the route connecting the AC power source and the heater, a power source synchronization signal of a power source applied to the heater and interrupts the route based on the power source synchronization signal.

Therefore, in a case when a current/voltage applied to the heater is phase-controlled, the route is interrupted when a current is not flowing, so that the temperature drop of the heater that is heating an object to be processed can be minimized.

A sixth invention is a heater inspection apparatus that further comprises, in any one of the first to fourth inventions, a warning unit that gives a warning that the heater needs replacement when a result of the finding of the deterioration degree of the heater by the finding unit indicates that the heater needs replacement.

Such urging of the heater replacement prevents the occurrence of heater disconnection and so on during actual heat treatment of an object to be processed.

A seventh invention is a heater inspection apparatus in which, in any one of the first to fourth inventions, the memory further stores a length and a cross sectional area of the heater at the reference time.

This facilitates the calculation of the resistance of the heater at the reference time.

An eighth invention is a semiconductor manufacturing apparatus that comprises a heater inspection apparatus according to any one of the first to fourth inventions.

This structure can prevent the occurrence of such a situation that the disconnection of a heater occurs during the manufacture of semiconductors, thereby preventing the manufacture of the semiconductors.

DETAILED DESCRIPTION OF THE PREFERRED EMBODIMENT(S)

An object to conduct an on-line inspection of the deterioration degree of a heater that is heated based on an AC power source has been realized without hindering an heating operation by the heater even while the heater is in the heating operation, through the direct utilization of the AC power source or through the utilization of an inserted power source for inspection different from the AC power source.

EXAMPLE 1

Hereinafter, the present invention will be explained with reference to the drawings.

Figure 1:
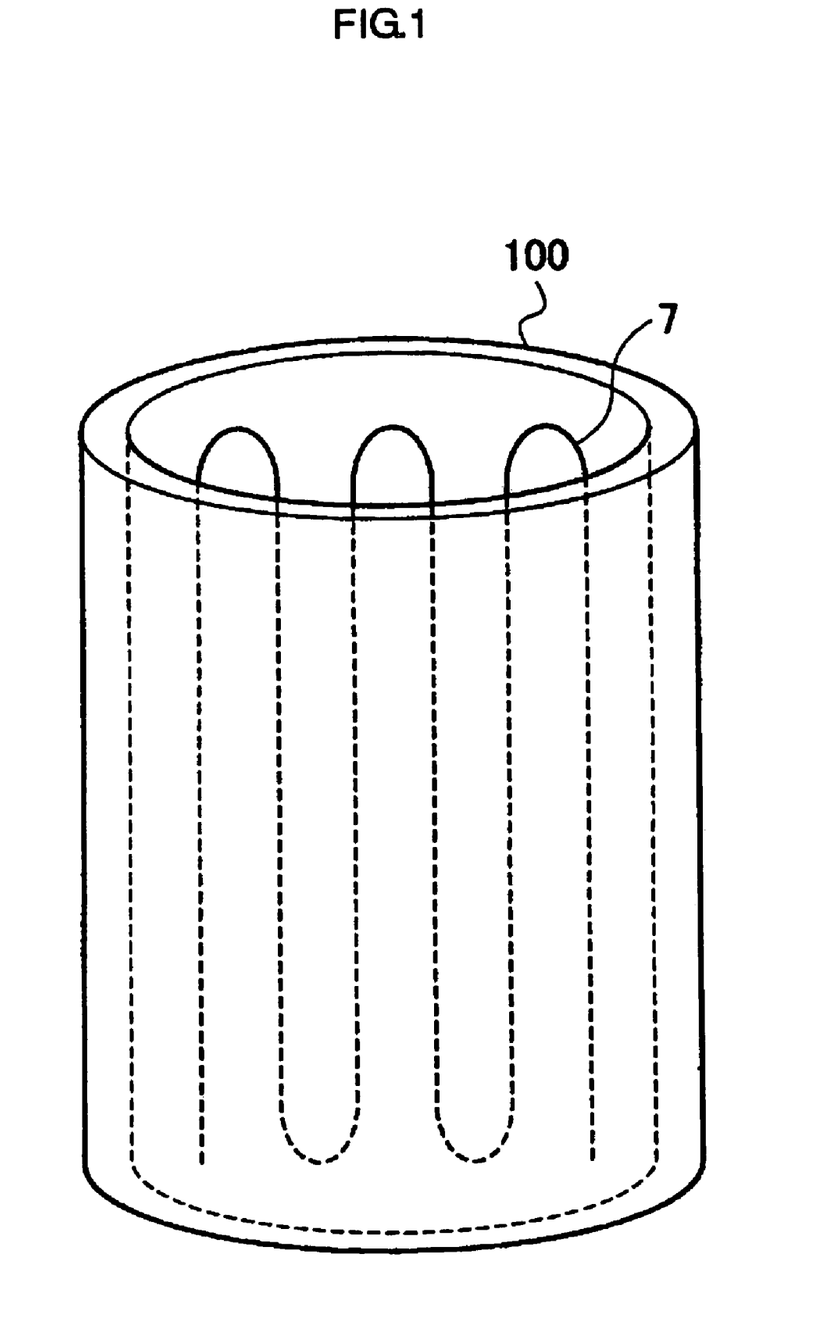
FIG. 1 is a perspective view showing the state in which a heater is attached to a vertical furnace that is a constituent element of a semiconductor manufacturing apparatus of an embodiment of the present invention.

FIG. 1 is a perspective view showing the state in which a heater is attached to a vertical furnace that is a constituent element of a semiconductor manufacturing apparatus of an embodiment of the present invention.

FIG. 1 shows the state in which a heater 7 that heats an object to be processed such as a semiconductor wafer is attached all over an inner wall of a vertical furnace 100 in a meandering manner. The heater 7 is made of a material essentially consisting of molybudenum disilicide, nichrome, and so on. A reaction tube constituting a process chamber into which an object to be processed is to be transferred is to be positioned in a region surrounded by the heater 7 shown in FIG. 1.

Figure 2:
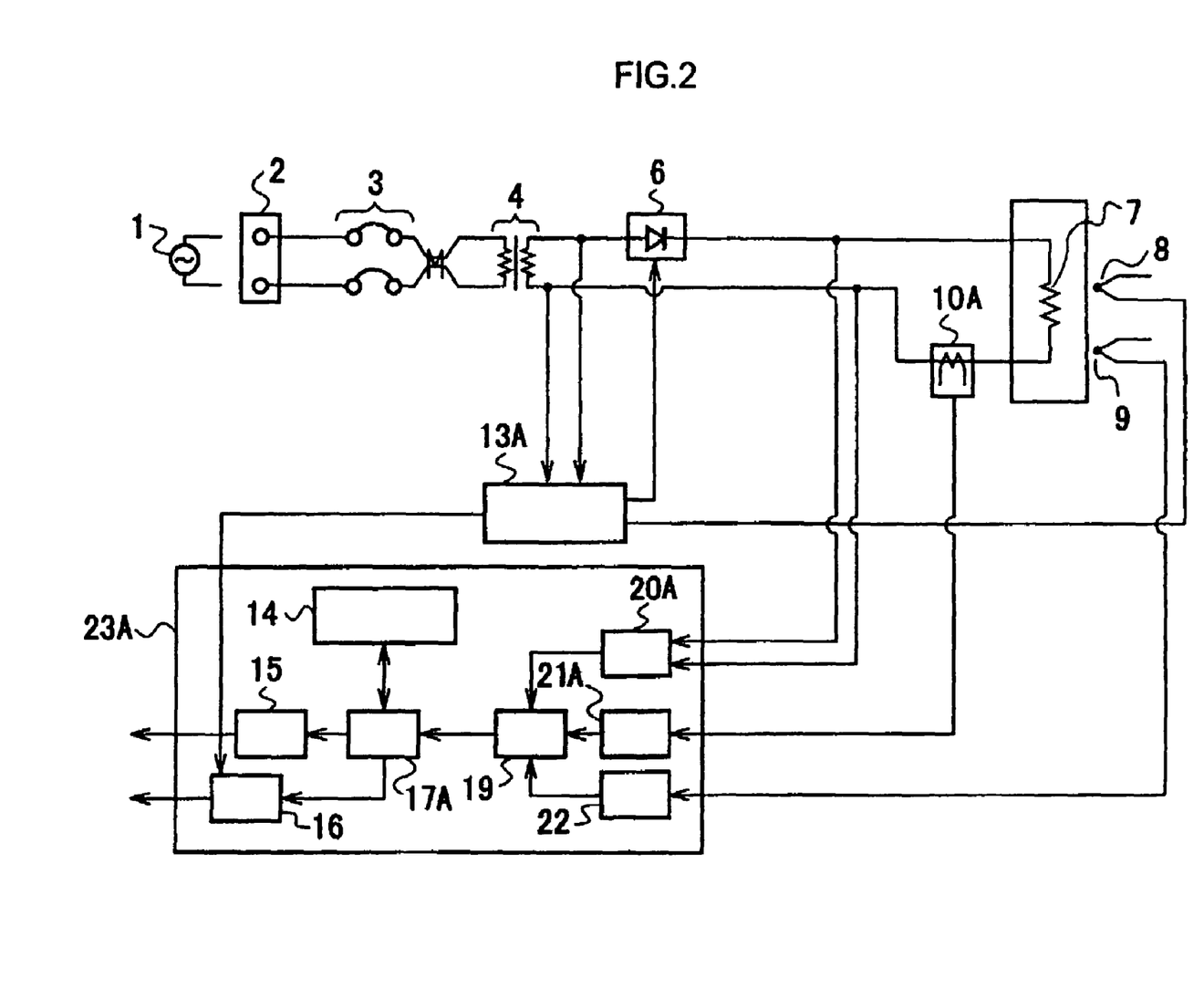
FIG. 2 is a circuit diagram of a heater and a heater inspection apparatus according to Example 1.

FIG. 2 is a circuit diagram of the heater shown in FIG. 1 and a heater inspection apparatus according to Example 1. Here, an applying unit that applies a power element is constituted of an AC power source that heats the heater.

FIG. 2 shows, in addition to the heater 7 shown in FIG. 1, a commercial power source 1, a terminal block 2 for power reception, a protective breaker (NFB) 3, a power source transformer 4, a thyristor 6, a thermocouple 8, a thermocouple 9, a current transformer 10A, a thermoregulator 13A, and a heater inspection apparatus 23A, which will be explained below.

The commercial power source 1 is an AC power source that applies an AC voltage to the heater 7 shown in FIG. 1.

The terminal block 2 for power reception is provided with a terminal that receives the voltage from the commercial power source 1 to transfer it to a heater 7 side.

The protective breaker (NFB) 3, which prevents excessive voltage application to the heater 7, is turned on at a normal time to electrically connect the commercial power source 1 and the heater 7, and is turned off when an excessive voltage may possibly be applied to the heater 7, thereby electrically disconnecting the commercial power source 1 and the heater 7.

The power source transformer 4 converts the voltage applied by the commercial power source 1 to a voltage usable in the heater 7.

The thyristor 6 is a switch element that regulates a current passed through the heater 7 by controlling the phase of the voltage converted in the power source transformer 4, and it is turned on when a temperature in the furnace measured at the thermocouple 8 is lower than a set temperature of the furnace, and is turned off when the temperature in the furnace measured at the thermocouple 8 is higher than the set temperature of the furnace.

The other thermocouple 9 is provided in addition to the thermocouple 8, and these two thermocouples 8, 9 output electrical signals based on the temperature of the heater 7 to a heater inspection apparatus 23A side. The thermocouple 8 measures the temperature in the furnace, based on which the measured temperature of the heater 7 is adjusted to be equal to the set temperature of the furnace, and is disposed in, for example, the semiconductor process chamber of the vertical furnace 100. The other thermocouple 9 measures the temperature of the heater 7 itself, based on which the deterioration degree of the heater 7 is found, and is disposed, for example, near the heater 7.

The current transformer 10A outputs to the heater inspection apparatus 23A side a current flowing through the heater 7.

The thermoregulator 13A controls on/off of the thyristor 6 based on the measured temperature corresponding to the electrical signal outputted from the thermocouple 8 and on the set temperature of the heater 7 that is set in advance, and transmits the measured temperature corresponding to the electrical signal outputted from the thermocouple 8 and on/off control information of the thyristor 6 to a higher device or the like.

The heater inspection apparatus 23A includes a table memory 14, a DO output unit 15, a communication interface (communication I/F) 16, an arithmetic unit (CPU) 17A, an A/D converter 19, a voltage detector 20A, a current detector 21A, and a temperature detector 22, which will be explained below.

In response to a command from the CPU 17A, the voltage detector 20A detects a level of the voltage applied to the heater 7 and outputs it to a CPU 17A side.

In response to a command from the CPU 17A, the current detector 21A detects a level of the current flowing through the heater 7 based on the current from the current transformer 10A and outputs it to the CPU 17A side.

In response to a command from the CPU 17A, the temperature detector 22 detects the temperature of the heater 7 based on the electrical signal outputted from the thermocouple 9 and outputs it to the CPU 17A side.

The A/D converter 19 converts detection results by the voltage detector 20A, the current detector 21A, and the temperature detector 22 from analog signals to digital signals.

The table memory 14 is a memory on which the identification number unique to the heater 7, the temperature coefficient of resistance of the heater 7, the length of the heater 7, the cross sectional area of the heater 7, and the resistance of the heater 7 at a reference time, for example, a reference resistance at the time of manufacture are stored as one set, as will be described later using FIG. 3.

Incidentally, a temperature-resistance characteristic of the heater 7 may be stored on the table memory 14 as a lookup table, thereby dispensing the CPU 17A from the work of calculating a theoretical resistance of the heater 7.

The arithmetic unit (CPU) 17A calculates the resistance of the heater 7 at the inspection time based on the detection results by the voltage detector 20A and the current detector 21A, which have been converted in the A/D converter 19 to the digital signals, and finds the deterioration degree of the heater 7 based on the calculated resistance of the heater 7 at the inspection time and the contents stored on the table memory 14.

The arithmetic unit (CPU) 17 also performs such controls over the operation of the heater inspection device 23A as giving a command that the found deterioration degree of the heater 7 should be transmitted to a higher device or the like, giving the DO output unit 15 a command that an alarm should be outputted from, for example, a speaker when the found deterioration degree of the heater 7 indicates that the heater 7 needs replacement, and so on.

In response to the command of the CPU 17A, the DO output unit 15 urges the not-shown speaker to output the alarm indicating that the heater 7 needs replacement.

The communication I/F 16 is an interface that connects the CPU 17A and the thermoregulator 13A to a higher device or the like.

Here, the principle of finding the deterioration degree of the heater 7 will be explained. For example, assuming that a temperature coefficient of resistance $\rho$ of a metal wire constituting the heater 7 is 1/° C. (at 20° C.) ($\Omega \cdot$m), a length 1 thereof is 1000 m, and a wire radius is 1 mm, then a cross sectional area S thereof is derived as 3.14×10⁻⁶ (m²), and therefore, a resistance R of the heater 7 is derived as follows.

$R = \rho \times l/S$, therefore, $R(20° \text{ C.}) = 1(\Omega \cdot m) \times 1000(m)/3.14 \times 10^{-6}(m^2)$
$= 3.185 \times 10^8 (\Omega)$ Assuming that the radius of the metal wire is reduced to 0.8 mm due to the deterioration of the heater 7 with time, a resistance R' of the heater 7 at this time is expressed as follows.

$R' = 1(\Omega \cdot m) \times 1000(m)/(0.0008 \times 0.0008 \times 3.14)(m^2)$
$= 4.976 \times 10^8 (\Omega)$ Therefore, the deterioration degree of the heater 7 can be found based on the change of an actual resistance of the heater 7 relative to a theoretical resistance of the heater 7.

Figure 3:
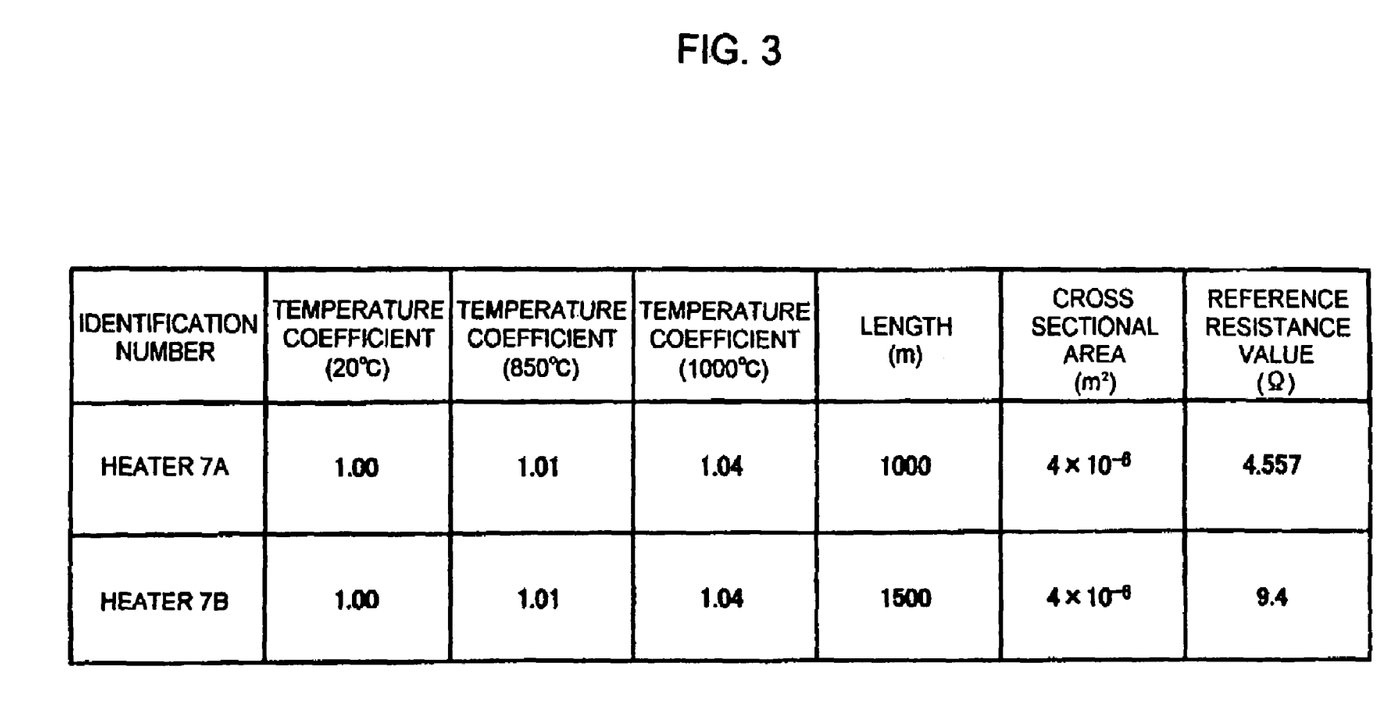
FIG. 3 is a table showing the contents stored on a table memory shown in FIG. 2.

FIG. 3 is a table showing the contents stored on the table memory 14 shown in FIG. 2.

FIG. 3 shows, as an example, a case when information on a heater 7A and a heater 7B that are usable as the heater 7 is stored.

Specifically, it shows a state in which the temperature coefficients of resistance 1.00 ($\Omega \cdot m$), 1.01 ($\Omega \cdot m$), 1.04 ($\Omega \cdot m$) when the heater 7A is heated to 20° C., 800° C., 1000° C., respectively, the length 1000 (m) of the heater 7A, the cross sectional area 4×10⁻⁶ (m²) of the heater 7A, and a reference resistance 4.557 ($\Omega$) of the heater 7A at the time of manufacture are stored so as to correspond to the heater 7A.

Further, it shows a state in which the temperature coefficients of resistance 1.00 ($\Omega \cdot m$), 1.01 ($\Omega \cdot m$), 1.04 ($\Omega \cdot m$) when the heater 7B is heated to 20° C., 800° C., 1000° C., respectively, the length 1500 (m) of the heater 7B, the cross sectional area 4×10⁻⁶ (m²) of the heater 7B, and a reference resistance 9.4 ($\Omega$) of the heater 7B at the time of manufacture are stored so as to correspond to the heater 7B.

Incidentally, it is only necessary for the table memory 14 to store at least the temperature coefficient of resistance corresponding to the temperature of the heater 7 at which the heater 7 is inspected, but a larger number of temperature coefficients of resistance may be stored thereon.

In this embodiment, the deterioration degree of the heater 7 is found based on numerical equations to be discussed later and the above-mentioned information.

Figure 4:
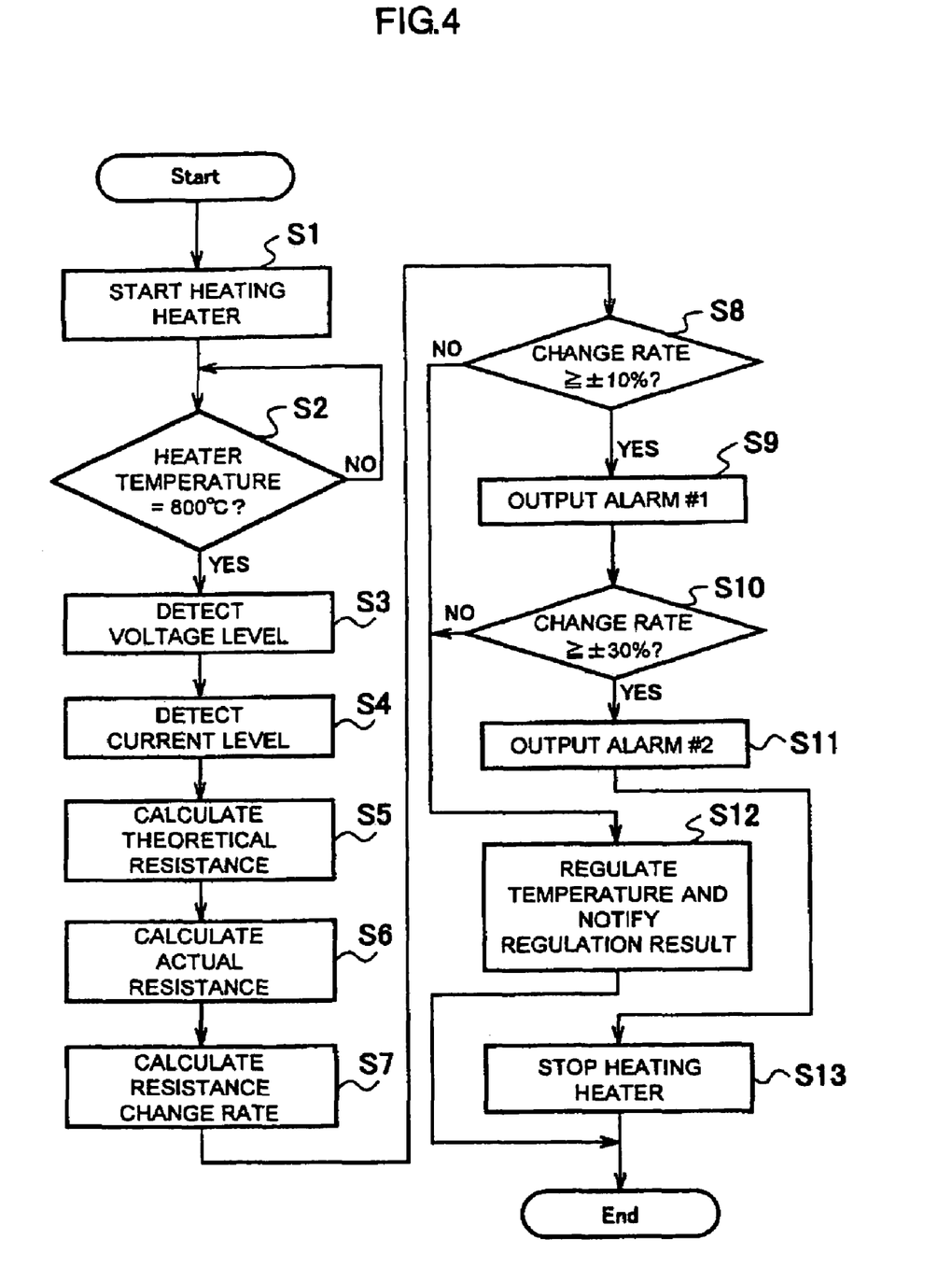
FIG. 4 is a flowchart showing the operation of the heater inspection apparatus according to Example 1.

FIG. 4 is a flowchart showing the operation of the semiconductor manufacturing apparatus and the heater inspection apparatus shown in FIG. 2.

First, the AC voltage of the commercial power source 1 is applied to the heater 7 to heat the heater 7, a target temperature being, for example, 800° C. (Step S1).

Specifically, when the AC voltage is applied to the vertical furnace of the semiconductor manufacturing apparatus from the commercial power source 1, the NFB 3 and the thyristor 6 are turned on by the control of the CPU 17A or the like, and the AC voltage of the commercial power source 1 is applied after being converted by the power source transformer 4 to a voltage usable in the heater 7, thereby heating the heater 7. This causes the vertical furnace to be in an idle state (standby state).

Next, the CPU 17A judges based on the electrical signal outputted from the thermocouple 9 that measures the temperature of the heater 7 itself whether or not the temperature of the heater 7 has reached, for example, 800° C. that is the inspection temperature of the heater 7, and this judgment is repeated until the temperature of the heater reaches 800° C. (Step S2).

When the heater 7 has reached, for example, 800° C. (a detected temperature T° C.), the voltage detector 20A detects the level of the voltage applied to the heater 7 (Step S3).

Further, the current detector 21A detects the level of the current flowing through the heater 7 based on a current from the current transformer 10A (Step S4).

The detection time required for detecting the current level in Step S4 including the time required for detecting 800° C. in the above-described Step S2 is, for example, of an order of several tens mm sec, and is about one second at the maximum. Alternatively, a series of these steps may be repeated to obtain a plurality of detection data. When the plural detection data are obtained, an average value of these data is adopted.

Note that the detection results by the voltage detector 20A, the current detector 21A, and the temperature detector 22 are converted from analog signals to digital signals by the A/D converter 19 to be outputted to the CPU 17A.

Next, the CPU 17A calculates the theoretical resistance R of the heater 7 at the detected temperature (T° C.) based on, for example, the detected temperature (T° C.) of the temperature detector 22 and the contents stored on the table memory 14 (Step S5).

The theoretical resistance R is expressed as $R = \rho_T \times l/S$ where $\rho_T$ (at T° C.) is the temperature coefficient of resistance at the detected temperature, l is the length of the heater 7, and S is the cross sectional area of the heater 7.

Next, the CPU 17A calculates the actual resistance R' of the heater 7 based on the detection results by the voltage detector 20A and the current detector 21A (Step S6).

The resistance R' can be expressed as $R' = V/I$ where V is the voltage level of the heater 7 and I is the current level of the heater 7.

Subsequently, the change rate of the actual resistance R' of the heater 7 relative to the theoretical resistance R of the heater 7 is calculated (Step S7).

Note that the change rate can be expressed as follows.

change rate = $(R-R')/R \times 100 (\%)$

Next, the CPU 17A judges whether or not the calculated change rate is, for example, ±10% or higher (Step S8).

When the result of the judgment shows that the change rate is, for example, 10% or higher, the CPU 17A judges that the heater 17 will need replacement soon and gives a command to that effect to the DO output unit 15, so that an alarm #1 is outputted from, for example, the speaker, and thereafter, the control shifts to Step S10 (Step S9).

In Step S10, it is judged whether or not the change rate is, for example, 30% or higher. When the result of the judgment shows that the change rate is, for example, 30% or higher, the CPU 17A judges that the heater 7 urgently needs replacement and outputs a command to that effect to the DO output unit 15, so that an alarm #2 whose tone, frequency, or the like is different from that of the alarm #1 is outputted from, for example, the speaker (Step S11).

Subsequently, in order to allow the replacement of the heater 7 without causing a defective lot of objects to be processed, the heating of the heater 7 is stopped before the object to be processed is actually transferred into the process chamber (Step S13).

On the other hand, when the change rate is not, for example, ±10% or higher, and when the change rate is not, for example ±30% or higher, the heater 7 is continued to be heated, and the thyristor 6 is turned on/off by the thermoregulator 13A based on the electrical signal outputted from the thermocouple 8 and the set temperature of the heater 7 that is set in advance, thereby continuing the idle state (standby state). Further, information indicated by the electrical signal outputted from the thermocouple 8 and on/off control information of the thyristor 6 are transmitted to a higher device or the like (Step S12).

As explained above, in Example 1, it is possible to urge the heater replacement in such a manner that the change between the theoretical heater resistance value and the actual heater resistance value at the same temperature is calculated to find the deterioration degree of the heater, and when the deterioration degree of the heater indicates the need for heater replacement, a warning to that effect is given. This makes it possible to make objective judgment not based on subjective judgment that depends on the experience of an operator, so that the heater replacement can be conducted before the disconnection occurs.

Further, since it is possible to find the deterioration degree of the heater, normal heat treatment can be constantly conducted in the furnace, so that no defective lot of the objects to be processed is caused, which enables productivity improvement. Especially, productivity improvement of the vertical furnace can be realized. Moreover, due to the accurate judgment of the deterioration of the heater, it is not necessary to prepare spare heaters and conduct periodical replacement of the heater with the spare heater, so that heater replacement may be conducted only when necessary, and in addition, such a problem does not arise that the disconnection occurs within a period of an estimated life span after the replacement.

Further, in Example 1, since the commercial power source is used as a power source for heater resistance measurement, no special power source for heater resistance measurement is required, which simplifies the configuration. Moreover, it is possible to realize an apparatus capable of inspecting the heater deterioration only by adding a heater inspection apparatus to an existing semiconductor manufacturing apparatus.

Further, the deterioration degree of the heater 7 can be found in the state in which the idle state (standby state), which is before the start of processing a semiconductor wafer by the semiconductor manufacturing apparatus, is being maintained as it is. Therefore, such situation does not occur that at the time of measuring the heater resistance, the temperature in the furnace that is heated by the heater based on the commercial power source is disturbed and the operation of the semiconductor manufacturing apparatus is hindered.

EXAMPLE 2

Figure 5:
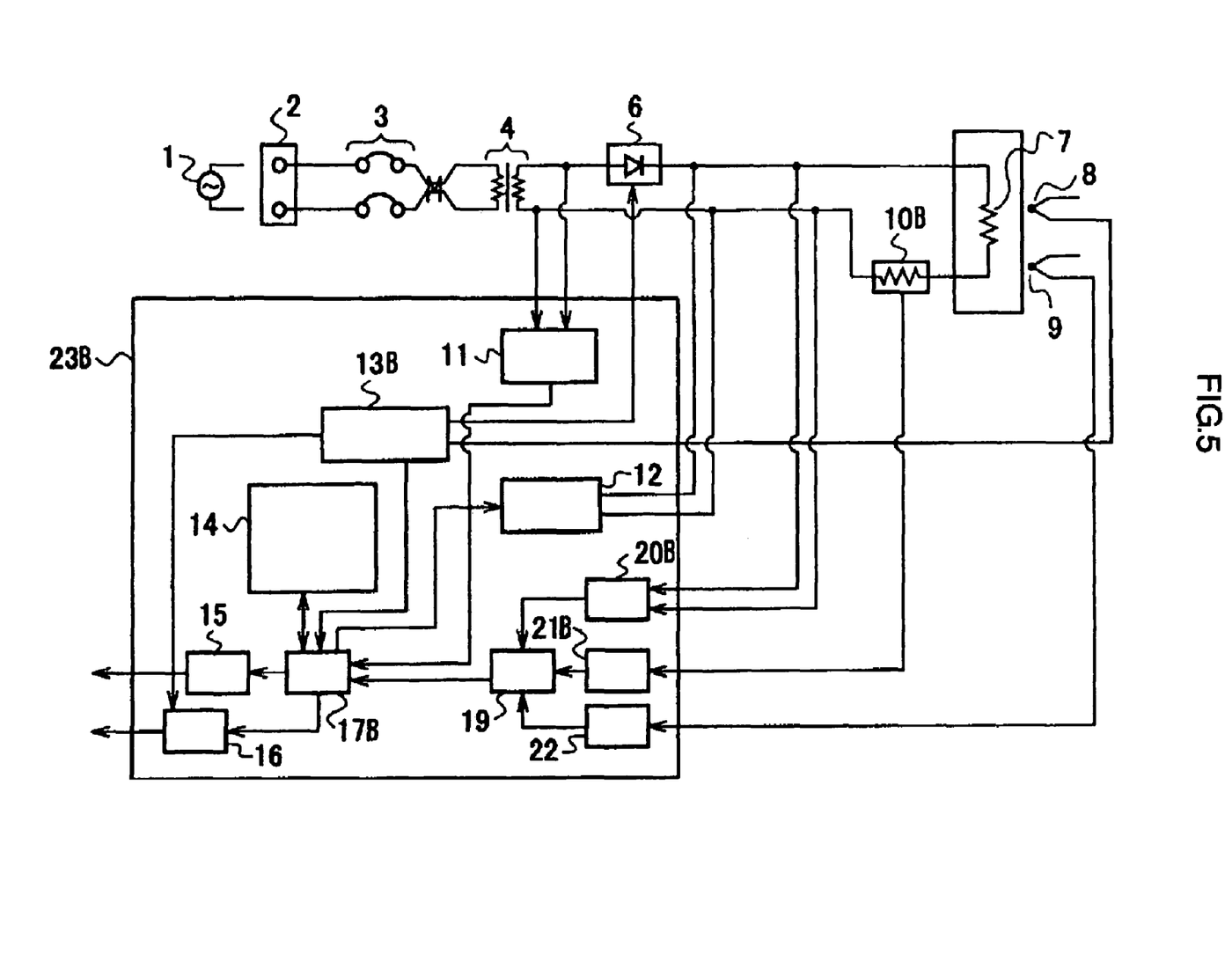
FIG. 5 is a circuit diagram of a heater and a heater inspection apparatus according to Example 2.

FIG. 5 is a circuit diagram of the heater shown in FIG. 1 and a heater inspection apparatus according to Example 2.

Here, an applying unit that applies a power element is constituted of a DC power source that applies a DC voltage, the DC power source being different from a commercial power source 1 that applies an AC power source to the heater 7. Note that the same reference numerals and symbols are used to designate the same portions as those explained using FIG. 2, and explanation thereof will be omitted.

FIG. 5 shows, in addition to the heater 7 shown in FIG. 1, the commercial power source 1, a terminal block 2 for power reception, a protective breaker (NFB) 3, a power source transformer 4, a thyristor 6, a thermocouple 8, a thermocouple 9, a shunt resistor 10B, and a heater control device 23B, which will be explained below.

The shunt resistor 10B separates a part of a current flowing through the heater 7 to output it to a heater control device 23B side.

The heater control device 23B includes an obtaining unit 11, a DC voltage generator 12, a thermoregulator 13B, a table memory 14, a DO output unit 15, a communication interface (communication I/F) 16, an arithmetic unit (CPU) 17B, an A/D converter 19, a voltage detector 20B, a current detector 21B, and a temperature detector 22, which will be explained below.

In response to a command from the CPU 17B, the voltage detector 20B detects a DC voltage generated by the DC voltage generator 12 and applied to both sides of the heater 7.

In response to a command from the CPU 17B, the current detector 21B detects a current that flows through the heater 7 when the. DC voltage generated by the DC voltage generator 12 is applied to the heater 7, based on the current separated by the shunt resistor 10B.

The obtaining unit 11 is connected to, for example, a secondary side of the power source transformer 4, and it obtains, from a route connecting a secondary side power source of the power source transformer 4 and the heater 7, a power source synchronization signal of the secondary side power source applied to the heater 7. Here, the power source synchronization signal of the secondary side power source is a signal synchronized with on/off of a current of the secondary side power source, whose passage is controlled by the thyristor 6.

The DC voltage generator 12 generates the DC voltage to be applied to the heater 7 while the thyristor 6 being an interrupting unit is phase-controlled to temporarily turn off the route based on the power source synchronization signal obtained by the obtaining unit 11. Therefore, the DC voltage generator 12 is connected, not via the thyristor 6 but directly, to the heater 7. The aforesaid power source synchronization signal is formed of a waveform of a voltage that is converted in the power source transformer 4 and phase-controlled by the thyristor 6.

The thermoregulator 13B phase-controls on/off of the thyristor 6 based on a measured temperature corresponding to an electrical signal outputted from the thermocouple 8 and on a set temperature of the heater 7 that is set in advance, and transmits the measured temperature corresponding to the electrical signal outputted from the thermocouple 8 and on/off control information of the thyristor 6 to a higher device or the like.

The arithmetic unit (CPU) 17B calculates the resistance of the heater 7 at the inspection time based on detection results, which are converted to digital signals in the A/D converter 9, of the voltage detector 20B and the current detector 21B, and finds the deterioration degree of the heater 7 based on the calculated resistance of the heater 7 at the inspection time and the contents stored on the table memory 14.

The arithmetic unit (CPU) 17B also gives a command that the found deterioration degree of the heater 7 should be transmitted to a higher device or the like; or gives the DO output unit 15 a command that an alarm should be outputted from, for example, a speaker when the found deterioration degree of the heater 7 indicates that the heater 7 needs replacement.

Figure 6:
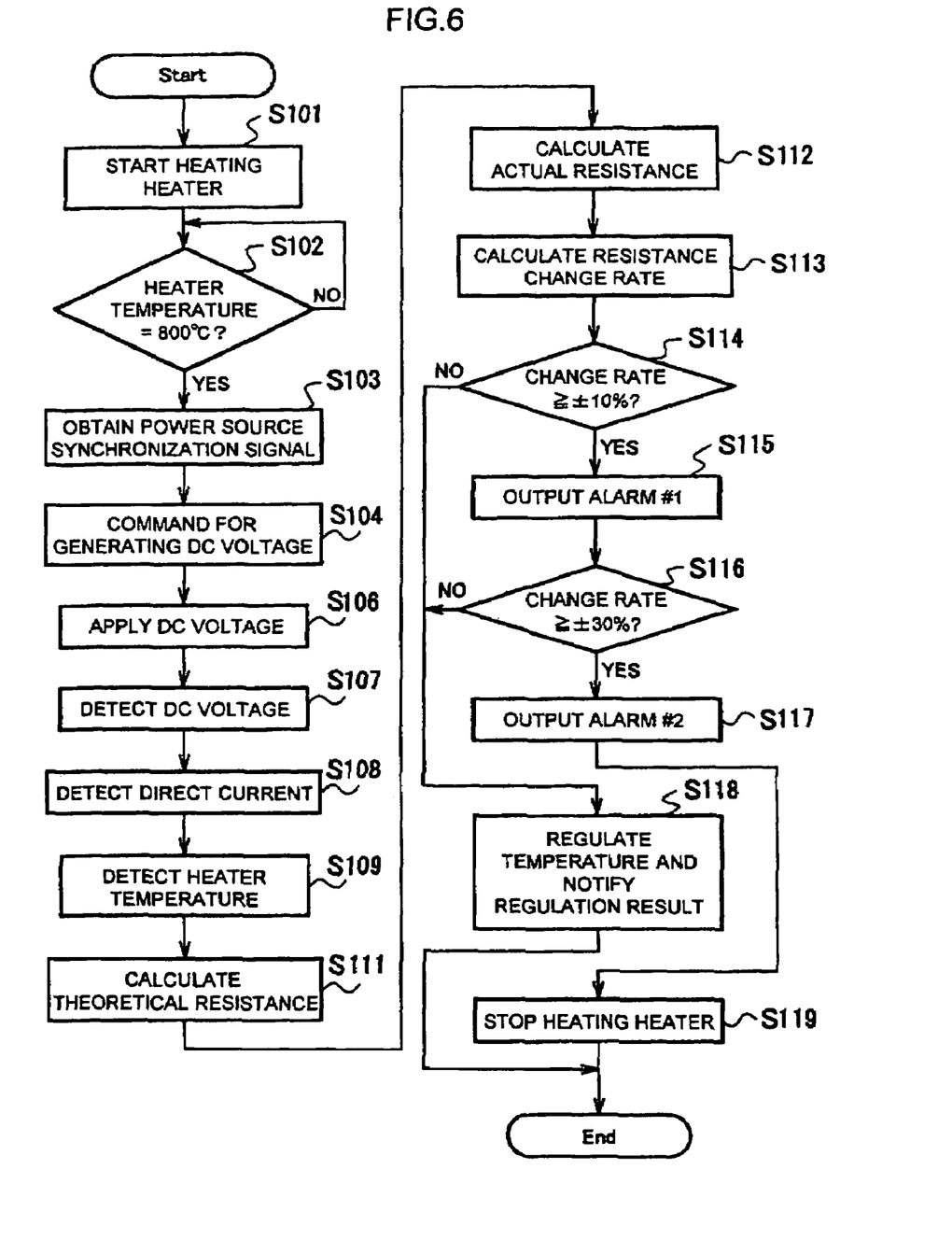
FIG. 6 is a flowchart showing the operation of the heater inspection apparatus according to Example 2.

Further, the arithmetic unit (CPU) 17B urges the DC voltage generator 12 to generate the DC voltage, and performs controls over the operation of the heater control device 23B such as giving a command that the about one second at the maximum. Alternatively, a series of the steps may be repeated during the interruption period to obtain a plurality of detection data, or a plurality of detection data may be obtained over a plurality of the interruption periods. When the plural detection data are obtained, an average value of these data is adopted.

When the thyristor 6 is turned off, a command is first given to the DC voltage generator 12 to generate the DC voltage to be applied to the heater 7 (Step S104).

Then, the CPU 17B applies the DC voltage generated by the DC voltage generator 12 to the heater 7 (Step S106).

In this state, the voltage detector 20B detects the DC voltage generated by the DC voltage generator 12 and applied to the heater 7 (Step S107).

Further, the current detector 21B detects the current flowing through the heater 7 based on the current separated by the shunt resistor 10B (Step S108).

Moreover, the temperature detector 22 detects a temperature (detected temperature T° C. which is 800° C. here) of the heater 7 based on the electrical signal outputted from the thermocouple 9 (Step S109).

Note that detection results by the voltage detector 20B, the current detector 21B, and the temperature detector 22 are converted from analog signals to digital signals by the A/D converter 19, and outputted to the CPU 17B.

Thus, the CPU 17B obtains the data for heater resistance measurement during the interruption period in which the thyristor 6 is turned off, but the current of the secondary side power source of the power source transformer 4 is under current passage control by the thyristor 6, during a data obtaining period and after the data obtaining period, not to mention a period before the data obtaining period, so that the temperature of the furnace is normally controlled so as to be the set temperature.

Next, the CPU 17B calculates a theoretical resistance R of the heater 7 at the detected temperature (T° C.) based on, for example, the detected temperature (T° C.) of the temperature detector 22 and the contents stored on the table memory 14 (Step S111).

Subsequently, the change rate of an actual resistance R' of the heater 7 relative to the theoretical resistance R of the heater 7 is calculated (Step S113).

Next, the CPU 17B judges whether or not the calculated change rate is, for example, ±10% or higher (Step S114).

When the result of the judgment shows that the change rate is ±10% or higher, the CPU 17B judges that the heater will need replacement soon to give a command to that effect to the DO output unit 15, so that an alarm #1 is outputted from, for example, the speaker, and thereafter, the control shifts to Step S116 (Step S115).

In Step S116, it is judged whether or not the calculated change rate is, for example 30% or higher. When the result of the judgment shows that the change rate is ±30% or higher, the CPU 17B judges that the heater 7 urgently needs replacement to give a command to that effect to the DO output unit 15, so that an alarm #2 whose tone, frequency, or the like is different from that of the alarm #1 is outputted from, for example, the speaker (Step S117).

Subsequently, in order to allow the replacement of the heater 7 without causing a defective lot of objects to be processed, the heating of the heater 7 is stopped before an object to be processed is actually transferred into a process chamber (Step S119).

On the other hand, when the change rate is not, for example, ±10% or higher, and when the change rate is not, for example ±30% or higher, the heater 7 is continued to be heated, and the thyristor 6 is turned on/off by the thermoregulator 13B based on the electrical signal outputted from the thermocouple 8 and the set temperature of the heater 7 that is set in advance, thereby continuing an idle state (standby state). Further, information indicated by the electrical signal outputted from the thermocouple 8 and on/off control information of the thyristor 6 are transmitted to a higher device or the like (Step S118).

As explained above, according to Example 2, the data on the heater is obtained not based on the commercial power source but based on the DC power source, so that no influence is given by distortions of a current waveform and a voltage waveform due to an AC power control state and no error is caused at the time of effective value/DC conversion. Consequently, the heater can be considered as a simple resistance in calculation. This realizes, in addition to the effect of Example 1, high-precision calculation of an actual resistance value.

Further, in Example 2, the DC voltage is applied to the heater during the interruption period of the route that is based on the on/off control of the thyristor and that is synchronized with the power source synchronization signal. Specifically, the actual data on the heater is measured during the period when the route connecting the secondary side power source and the heater is interrupted by the phase control of the thyristor, so that the temperature in the furnace that is heated by the heater based on the commercial power source is not disturbed even when the DC voltage is applied to the heater at the time of heater resistance measurement. In addition, since the period during which the heater is heated by the DC voltage generator 12 is very short, so that the temperature in the furnace is not disturbed by the heating by the DC power source.

Furthermore, in Example 2, the DC voltage is applied to the heater during the interruption period of the route that is based on the on/off control of the thyristor and that is synchronized with the power source synchronization signal, but it is also possible to forcibly turn off the thyristor for a predetermined period for heater inspection and apply the DC voltage to the heater during this off-period (route interruption period), as long as this period is within a period not giving influence to the control of the temperature in the furnace.

EXAMPLE 3

In Example 2 described above, the applying unit that applies the power element is constituted of the DC voltage generator that applies the DC voltage to the heater, but the present invention is not limited to this and the applying unit may be constituted of a DC current generator.

In Example 3, a DC current generator is provided in place of the DC voltage generator 12 in Example 2 (refer to FIG. 5), and an applying unit that applies a power element is constituted of a DC constant current source that supplies a direct current to a heater.

The DC constant current source in place of the DC voltage generator 12 is connected to the heater not via a thyristor 6 so that a closed loop is formed between the DC constant current source and the heater. An arithmetic unit (CPU) 17B controls the DC constant current source so that the DC constant current source constantly supplies a DC constant current value to the heater 7 irrespective of whether the thyristor 6 turns off a route or turns on the route, the DC constant current value being within a range not influencing the temperature of the heater that is heated by an AC power source 1. Further, the arithmetic unit (CPU) 17B follows a similar flow to that in Example 2 to calculate a change rate of an actual resistance R' of the heater 7 relative to a theoretical resistance R of the heater 7 and conduct heater inspection based on the DC constant current supplied from the DC constant current source, when the thyristor 6 is temporarily turned off via a thermoregulator 13B based on a power source synchronization signal obtained by an obtaining unit 11.

In Example 3, since the DC constant current is constantly supplied to the heater, a loss time at the changeover time of the route is eliminated, which allows quick heater inspection.

It should be noted that the present invention is not limited to be applied to a vertical furnace, but is applicable to any apparatus, for example, a wafer-by-wafer furnace or the like in which the number of objects to be processed that are processed at a time is within a range of as small as about one to three, as long as it is a semiconductor manufacturing apparatus having constituent element for heating a heater. Moreover, the present invention is applicable to any semiconductor manufacturing apparatus as long as it has a heater, irrespective of the kind of the apparatus.

Moreover, in the above-described examples, it is judged whether or not the inspection temperature of the heater has reached a predetermined temperature (800° C.), but a heater may be inspected at an arbitrary temperature. In this case, it is suitable that a temperature coefficient of resistance that is the closest to the inspection temperature is selected and used in calculating the theoretical resistance R.

As explained hitherto, according to the present invention, the deterioration degree of a heater can be found, so that a warning indicating the need for heater replacement can be given when necessary, thereby urging heater replacement.

What is claimed is:

1. A heater inspection apparatus comprising:
   an applying unit that applies an electrical power to a heater based on an AC power source;
   a current detector that detects a current flowing through the heater when the electrical power is applied to the heater by said applying unit;
   a voltage detector that detects a voltage applied to the heater when the electrical power is applied to the heater by said applying unit;
   a temperature detector that detects a temperature of the heater;
   a memory on which a temperature coefficient of resistance for use in calculation of a resistance of the heater at a reference time is stored in advance;
   a first calculating unit that calculates a resistance of the heater at an inspection time based on respective detection results of said voltage detector and said current detector;
   a second calculating unit that calculates the resistance of the heater at the reference time based on a detection result of said temperature detector and the temperature coefficient of resistance stored on said memory; and
   a finding unit that finds a deterioration degree of the heater based on the resistance of the heater at the inspection time calculated by said first calculating unit and the resistance of the heater at the reference time calculated by said second calculating unit.

2. A heater inspection apparatus according to claim 1, wherein said applying unit that applies the electrical power is the AC power source,
   wherein said current detector detects a level of a current flowing through the heater when an AC voltage is applied to the heater by said AC power source,
   wherein said voltage detector detects a level of a voltage applied to the heater when the AC voltage is applied to the heater by said AC power source, and
   wherein said temperature detector detects a temperature of the heater.

3. A heater inspection apparatus according to claim 1, further comprising
   an interrupting unit that interrupts a route between the AC power source and the heater,
   wherein said applying unit that applies the electrical power is a DC power source that applies a DC voltage to the heater when said interrupting unit is interrupting the route,
   wherein said current detector detects a current flowing through the heater when the DC voltage is applied to the heater by said DC power source,
   wherein said voltage detector detects a DC voltage applied to the heater when the DC voltage is applied to the heater by the DC power source, and
   wherein said temperature detector detects a temperature of the heater.

4. A heater inspection apparatus according to claim 1, further comprising
   an interrupting unit that interrupts a route between the AC power source and the heater,
   wherein said applying unit is a DC constant current source that supplies a constant direct current to the heater irrespective of whether the route is interrupted or not interrupted by said interrupting unit,
   wherein said current detector detects a current made to flow through the heater by the DC constant current source, while the route is being interrupted by said interrupting unit,
   wherein said voltage detector detects a DC voltage applied to the heater by the DC constant current source, while the route is being interrupted by said interrupting unit, and
   wherein said temperature detector detects a temperature of the heater, while the route is being interrupted by said interrupting unit.

5. A heater inspection apparatus according to claim 3,
   wherein said interrupting unit obtains, from the route connecting the AC power source and the heater, a power source synchronization signal of a power source applied to the heater and interrupts the route based on the power source synchronization signal.

6. A heater inspection apparatus according to claim 1, further comprising
   a warning unit that gives a warning that the heater needs replacement when a result of the finding of the deterioration degree of the heater by said finding unit indicates that the heater needs replacement.

7. A heater inspection apparatus according to claim 1, wherein said memory further stores a length and a cross sectional area of the heater at the reference time.

8. A semiconductor manufacturing apparatus, comprising a heater inspection apparatus according to claim 1.

9. A heater inspection apparatus according to claim 4, wherein said interrupting unit obtains, from the route connecting the AC power source and the heater, a power source synchronization signal of a power source applied to the heater and interrupts the route based on the power source synchronization signal.

10. A heater inspection apparatus according to claim 2, further comprising
a warning unit that gives a warning that the heater needs replacement when a result of the finding of the deterioration degree of the heater by said finding unit indicates that the heater needs replacement.

11. A heater inspection apparatus according to claim 3, further comprising
a warning unit that gives a warning that the heater needs replacement when a result of the finding of the deterioration degree of the heater by said finding unit indicates that the heater needs replacement.

12. A heater inspection apparatus according to claim 4, further comprising
a warning unit that gives a warning that the heater needs replacement when a result of the finding of the deterioration degree of the heater by said finding unit indicates that the heater needs replacement.

13. A heater inspection apparatus according to claim 2, wherein said memory further stores a length and a cross sectional area of the heater at the reference time.

14. A heater inspection apparatus according to claim 3, wherein said memory further stores a length and a cross sectional area of the heater at the reference time.

15. A heater inspection apparatus according to claim 4, wherein said memory further stores a length and a cross sectional area of the heater at the reference time.

16. A semiconductor manufacturing apparatus, comprising
a heater inspection apparatus according to claim 2.

17. A semiconductor manufacturing apparatus, comprising
a heater inspection apparatus according to claim 3.

18. A semiconductor manufacturing apparatus, comprising
a heater inspection apparatus according to claim 4.

* * * * *